US008473167B2

(12) United States Patent
Bark et al.

(10) Patent No.: US 8,473,167 B2
(45) Date of Patent: Jun. 25, 2013

(54) LIFT GATE CONTROL SYSTEM

(75) Inventors: Paul Bark, Canyon Lake, CA (US);
Sheralin Lafferty, Pomona, CA (US);
Karapet Ablabutyan, Glendale, CA (US)

(73) Assignee: RS Drawings, LLC, Sante Fe Springs, CA (US)

( * ) Notice: Subject to any disclaimer, the term of this patent is extended or adjusted under 35 U.S.C. 154(b) by 352 days.

(21) Appl. No.: 12/821,995

(22) Filed: Jun. 23, 2010

(65) Prior Publication Data
US 2010/0322751 A1   Dec. 23, 2010

Related U.S. Application Data

(63) Continuation-in-part of application No. 12/167,995, filed on Jul. 3, 2008, now abandoned.

(51) Int. Cl.
| G06F 7/70 | (2006.01) |
| G06F 19/00 | (2006.01) |
| G06G 7/00 | (2006.01) |
| G06G 7/76 | (2006.01) |

(52) U.S. Cl.
USPC ............................................................. 701/50

(58) Field of Classification Search
USPC ............................................................. 701/50
See application file for complete search history.

(56) References Cited

U.S. PATENT DOCUMENTS

| 4,724,332 A * | 2/1988 | Finger .......................... 307/10.7 |
| 5,499,154 A | 3/1996 | Cullison |
| 6,907,334 B2 | 6/2005 | Yoshida et al. |
| 2002/0197142 A1 * | 12/2002 | Anderson et al. ............. 414/557 |
| 2004/0054456 A1 * | 3/2004 | Yoshida et al. ................. 701/41 |
| 2005/0238471 A1 * | 10/2005 | Ablabutyan et al. .......... 414/546 |

OTHER PUBLICATIONS

U.S. Non-final Office Action for U.S. Appl. No. 12/167,995 mailed Apr. 5, 2010, United States.

* cited by examiner

*Primary Examiner* — Mary Cheung
*Assistant Examiner* — Frederick Brushaber
(74) *Attorney, Agent, or Firm* — Michael Zarrabian, Esq.; Sherman & Zarrabian LLP

(57) ABSTRACT

A lift gate system includes a lift gate assembly comprising an actuator system for actuating a lift gate, an interface device for receiving lift gate operation information from an operator, and a main controller device comprising a solid state relay switch for controlling electrical power to the actuator system. The main controller device further includes a microcontroller configured for determining that one or more conditions are satisfied, and upon satisfaction of said one or more conditions, then controlling the actuator system via the solid state relay switch based on the received information from the operator for controlling operation of the lift gate assembly accordingly.

28 Claims, 8 Drawing Sheets

Red:
- Flashes if battery voltage is under 12.2V (24.4V)
- On if battery voltage is over 12.2V (24.4V)

Yellow:
- On if battery voltage is over 12.4V (24.8V)

Green:
- Flashes if battery voltage is over 15.5V (31.0V).
- On if battery voltage is over 12.6V (26.2V)

Red (ERROR):
- Solid –Pump motor over temperature error
- One Short Blink –High temperature error
- Long Blink and One Short Blink –Cab switch on
- Two Short Blinks –Lift over current error
- Long and Two Short –Pump motor current surge error
- Three Short Blinks –Pump motor over current error
- Four Short Blinks –Open FET error
- Five Short Blinks –Shorted FET error
- Flashing –Low battery

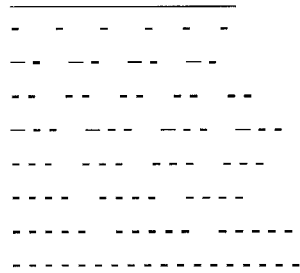

Blue:
- Flashes when a button is pressed.

IR:
- Send infrared (IR) data to printer or hand-held display before lifts are displayed on LEDs.

LIFT GATE CONTROL SYSTEM

CROSS-REFERENCE TO RELATED APPLICATION

This application is a continuation-in-part of, and claims priority under 35 U.S.C. §120 to, U.S. patent application Ser. No. 12/167,995 filed on Jul. 3, 2008, incorporated herein by reference.

BACKGROUND OF THE INVENTION

The present invention relates generally to controllers, and in particular, to controllers for lifts such as lift gates or wheelchair lifts.

Lift gates are typically mounted at a structure such as the rear of a vehicle to lift payloads on a platform from one level (e.g., ground level) up to another level (e.g., the bed of the vehicle), or vice versa.

One type of lift gate employs linkages to maintain the lift platform in a horizontal plane through the lifting range. The lift platform is attached to linkages by pivot members, which allow the lift platform to be pivoted. When in the vertical position, operation of the lifting mechanism rotates the lift platform into an inverted, stowed position beneath the vehicle body. Hydraulic actuators and electric actuators are used to provide lifting force for moving the lift. Another type of lift gate is a rail lift gate. To control the motion of the lift, switches are wired to the actuators for controlling motion of the lift by an operator interacting with the toggle switches.

BRIEF SUMMARY OF THE INVENTION

In one embodiment, the present invention provides a lift gate system that includes a lift gate assembly comprising an actuator system for actuating a lift gate, an interface device for receiving lift gate operation information from an operator, and a main controller device comprising a solid state relay switch for controlling electrical power to the actuator system. The main controller device further includes a microcontroller configured for determining that one or more conditions are satisfied, and upon satisfaction of said one or more conditions, then controlling the actuator system via the solid state relay switch based on the received information from the operator for controlling operation of the lift gate assembly accordingly.

These and other features, aspects and advantages of the present invention will become understood with reference to the following description, appended claims and accompanying figures.

BRIEF DESCRIPTION OF THE DRAWINGS

FIG. 4 shows an example of LED display of information in the lift gate system of FIG. 2, according to an embodiment of the invention.

DETAILED DESCRIPTION OF THE INVENTION

The following description is made for the purpose of illustrating the general principles of the invention and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification as well as meanings understood by those skilled in the art and/or as defined in dictionaries, treatises, etc.

The present invention provides a lift gate system, which in one embodiment comprises a lift gate assembly including an actuator for actuating a lift gate, and a main controller configured for controlling the actuator.

Figure 1:
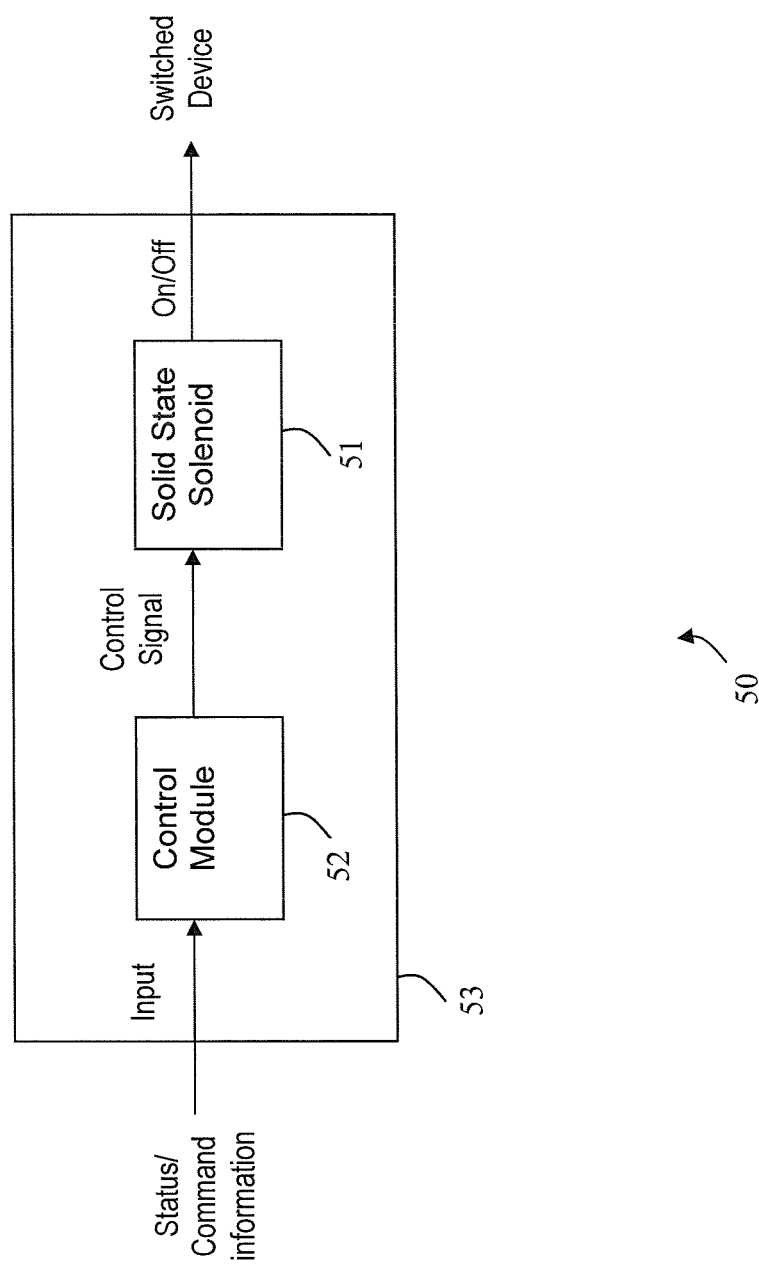
FIG. 1 shows a block diagram of a main controller for controlling operations of a lift gate assembly, according to an embodiment of the invention.

Referring to FIG. 1, in one embodiment of the invention, a main controller 50 comprises a non-mechanical switch in the form of a solid state solenoid switch device 51 and a control module device 52 configured for lift gate operation control, providing feedback information for an operator. The solid state solenoid switch device 51 and the control module device 52 are preferably implemented on a single circuit module such as a printed circuit board (PCB) 53. The main controller 50 integrates the functions of lift gate control and also a solid state solenoid switch relay device, all on one PCB, as described further below in relation to FIGS. 7A-7C.

Figure 2:
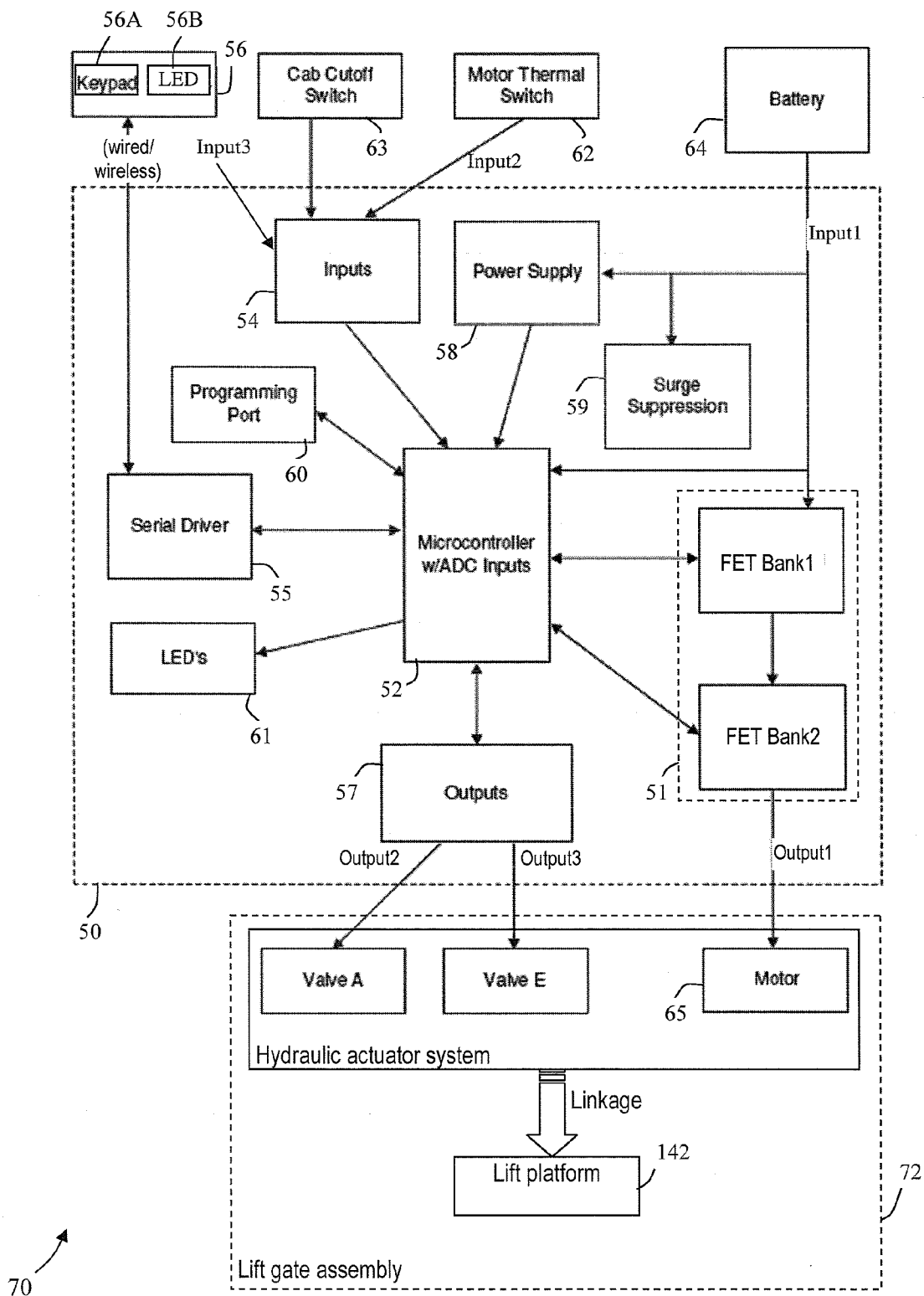
FIG. 2 shows a block diagram of a lift gate system including a more detailed diagram of the main controller of FIG. 1, according to an embodiment of the invention.

FIG. 2 shows a block diagram of an example lift system 70 including an example implementation of the main controller 50 for controlling a lift gate assembly 72, according to an embodiment of the invention.

The main controller 50 further comprises signal input interface 54, a serial driver interface 55 for interfacing with a user interface device 56 including a keypad 56A and display device such as LED(s) 56B (or liquid crystal display (LCD), etc.), and a signal output interface 57.

The main controller 50 may further include a power supply 58, surge protection circuit 59, programming port 60, onboard status display 61 such as light emitting diodes (LEDs). The main controller 50 may be powered by the vehicle electrical power system or have the dedicated power supply 58 (e.g., battery).

In an embodiment of the invention, the control module device 52 comprises a microcontroller configured for controlling the lift gate assembly 72. The microcontroller can comprise a microprocessor configured with code in memory, or an application specific integrated circuit, or firmware, etc. The microcontroller 52 receives status and command information, and based on implemented logic generates control signals for controlling the lift gate assembly. In an implementation of the invention, the microcontroller 52 receives status input signals from sensors/components such as at least one or more of: an actuator pump motor thermal switch 62, a cut off switch 63 (which may reside in the cabin of a vehicle to which the lift gate assembly is attached), the solid state solenoid switch device 51 and a lift gate battery 64 that powers a lift gate actuator pump motor 65 via the solid state solenoid switch device 51. In one example, the pump motor 65 comprises an electrical motor that spins a pump for pumping hydraulic fluid from a reservoir to/from an actuator for raising/lowering the lift gate platform.

The microcontroller 52 further receives command input signals from at least the serial driver 55 which provides operator lift operation input commands from the interface 56.

Figure 3:
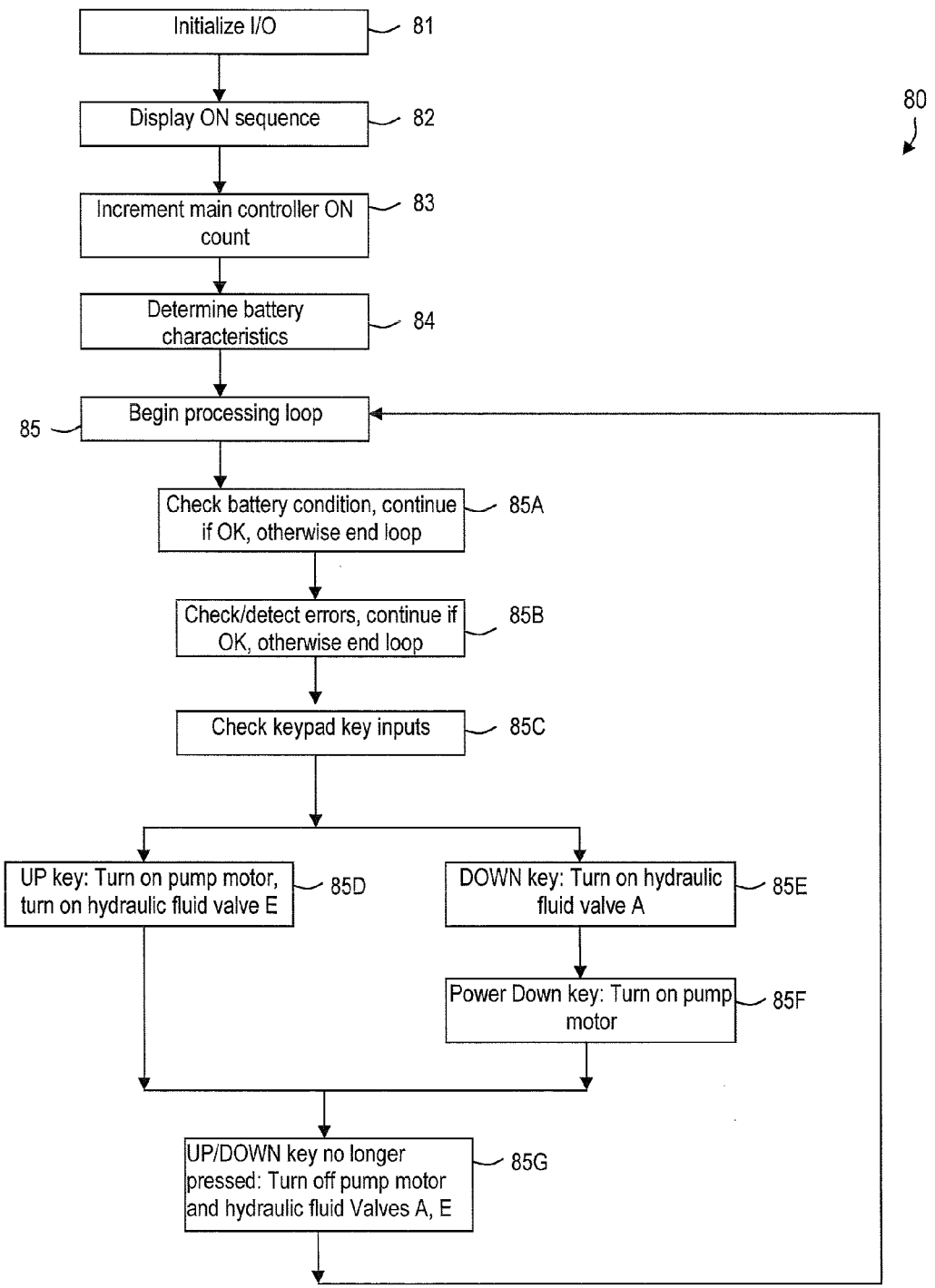
FIG. 3 shows a flowchart of an example process implemented by the main controller of FIG. 2 for controlling operation of the lift gate assembly, according to an embodiment of the invention.

In one embodiment, the microcontroller 52 implements a lift logic process 80 as shown in FIG. 3, for controlling operation of the lift gate assembly 72, including the following process blocks:

Block 81: Initialize main controller input and output (I/O).

Block 82: Display ON sequence (e.g., turn keypad LEDs 56B on for 1 second, turn keypad LEDs 57B off for ½ second).

Block 83: Increment the number of times main controller 50 has turned on.

Block 84: Read voltage and current from battery 64 to determine power condition and characteristics (e.g., if voltage is above 18 volts then set the 24V flag otherwise clear the 24V flag).

Block 85: Begin processing loop:

Block 85A: Check volts and amps of the battery 64. If below a threshold, end loop.

Block 85B: Detect/check for errors. If errors, then end loop.

Block 85C: Check inputs from the keypad 56.

Block 85D: If UP key is pressed, then turn on the pump motor 65 via the solid state solenoid switch device 51 and turn on hydraulic fluid Valve E via output interface 57. In one example, Valves A and E in combination control hydraulic fluid for raising/lowering the platform (for powered lowering of the lift platform, turn on Valve A; for powered raising of the lift platform, turn on Valve E).

Block 85E: If DOWN key is pressed then turn on Valve A via output interface 57. This allows the lift platform to lower under power of gravity (i.e., gravity down).

Block 85F: If Power Down key is enabled, also turn on the pump motor 65 via the solid state solenoid switch device 51. This allows powered lowering of the lift platform.

Block 85G: If UP or DOWN key is no longer pressed, then turn off Valves A and E via the output interface 57, and turn off pump motor 65 via the solid state solenoid switch device 51.

Repeat processing loop blocks 85A-G (e.g., a preset or programmable number of repetitions per second) until the main controller 50 is powered down.

In one example, processing block 85B for checking for errors comprises:

If cab switch is on, and an operator attempts to operate the lift platform, then "cab switch on" error is displayed to the operator.

If pump motor thermal switch is open indicating high pump motor temperature, then "pump motor over temperature" error is detected.

If an internal temperature sensor of the controller that checks temperature of the controller components (such as FETs in FIG. 6), reads over a threshold (e.g., about 100° C.) then "high temperature error" is detected. The high temperature error will clear when temperature drops below a threshold (e.g., about 90° C.).

If battery voltage is over a threshold (e.g., about 15.5 V or 31.0 V) then "high battery volts" error is detected.

If pump motor is on and voltage across the solenoid switch exceeds a threshold (e.g., about 8.0V) then "pump motor current surge error" is detected. This error may be latched, e.g., for about 20 seconds.

If pump motor is on and voltage across the solenoid switch exceeds a threshold (e.g., about 4.0V) then "pump motor over current error" is detected. This error may be latched, e.g., for about 20 seconds.

If pump motor and valves have been off for a time period (e.g., about at least 10 seconds) and battery voltage is below a threshold (e.g., about 12.2 V) then "low battery error" is detected.

If the battery is low (i.e., "low battery error"), the lift gate platform is permitted by the microcontroller to raise but not to lower in a complete cycle. When low battery is detected, the microcontroller allows Valve E to be activated to raise the lift platform, but Valve A cannot be activated to lower the lift platform.

All other errors cause the microcontroller to prevent the lift gate platform from raising or lowering, such as by not sending control open/close signals to the Valves A and E.

Lift cycle counter:

A lift cycle is counted by the microcontroller 52 if the lift platform goes down for more than a time period (e.g., about 4 seconds) and then the UP Key is pressed. Whenever the pump motor and valves are to be turned on together the valves A and E are turned on for a time period (e.g., for about 150 ms) before the pump motor is turned on.

The control module device further provides lift security lock outs and disable functions, information about state of charge of batteries, and low battery shut down of the lift gate assembly.

An example keypad may have an input voltage of about 6.0 VDC to 33.75 VDC, and have an operational temperature range of about −40° C. to 85° C. In one example, the keypad includes buttons for lift gate operations such as UP, DOWN, RIGHT or FOLD, LEFT or UNFOLD. The microcontroller 52 is further configured to perform the following operations:

In one embodiment, the microcontroller 52 is further configured to enable the key pad 56 for lift gate assembly operation, the following key sequence is required by the microcontroller: RIGHT, LEFT, RIGHT. This sequence enables the keypad for lift gate assembly operation. After the key sequence, the LEDs on the keypad (and optionally on the controller) will cycle and then the lift gate status will be displayed on the keypad LEDs. If a key is not pressed for a time period (e.g., about 60 seconds) the keypad is disabled again.

In one embodiment, the microcontroller 52 is further configured to display the number of lift cycles the following key sequence is required by the microcontroller: RIGHT, LEFT, LEFT, LEFT. The keypad is used to either operate the lift or check status. This sequence causes the microcontroller to send lift operation cycle information via a wired connection or a wireless connection (e.g., via an Infrared (IR) LED) to display the number of lift cycles using the LEDs on the keypad. After the key sequence, certain LEDs (e.g., top four LEDs) will flash a number of times (e.g., twice) to indicate number of lift operation cycles (e.g., lift platform raised and lowered), then the cycle information is sent via the IR LED and the number of lift cycles will be displayed on the LEDs. For example, an LED will flash once for each 10,000 lift cycles, another LED will flash once for each 1,000 lift cycles, another LED will flash once for each 100 lift cycles, and another LED will flash once for each 10 lift cycles.

In one embodiment, the microcontroller 52 is further configured such that holding any keypad key for a time period (e.g., more than about 3 seconds) while the keypad is disabled, will cause the LEDs to flash and the keypad to reset. Upon reset the key sensitivity may be recalibrated.

FIG. 4 shows an example of LED operation scenario 40 for an example set of keypad LEDs 56B, under control of the microcontroller 52, according to an embodiment of the invention. FIG. 4 illustrates example on/off status and blinking pattern for Red, Yellow, Green, Blue and Infrared (IR) LEDs. Other example configurations are also possible based on the desired information for display. Further, in addition to or in place of the LEDs, the keypad may include a display screen (such as a liquid crystal display (LCD)) that provides graphical/textual information. The keypad may also include a speaker for audio output of information.

Figure 5:
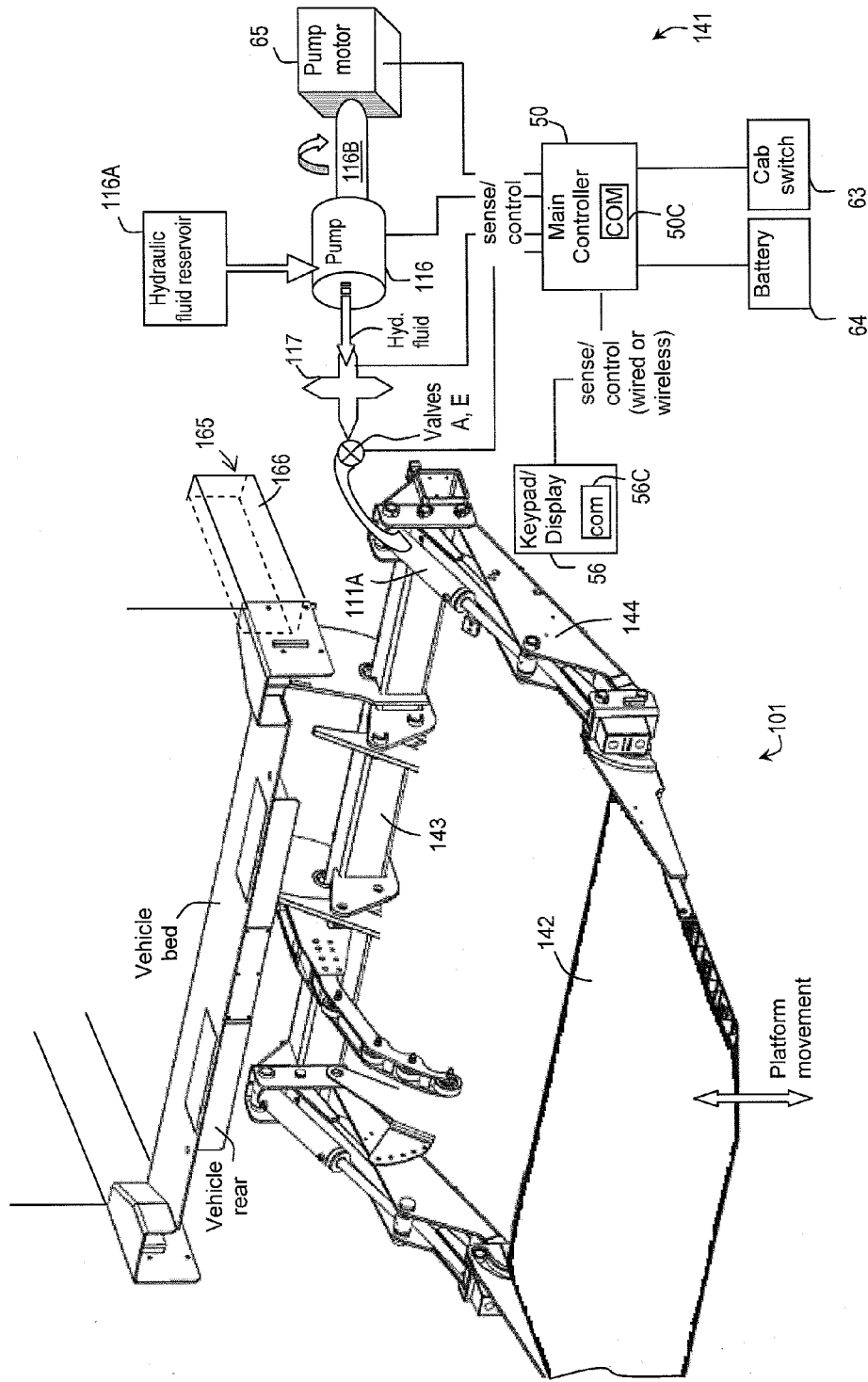
FIG. 5 shows an example implementation of the lift gate system of FIG. 2 on a vehicle, according to an embodiment of the invention.

FIG. 5 shows an example lift system 100 comprising a lift gate assembly 101 and power system 141, according to an embodiment of the invention. The lift gate assembly 101 is attached to a vehicle (bed of truck, partially shown) and includes a platform 142 (shown in unfolded and lowered position) coupled to a support frame 143 via a lift linkage 144, wherein the platform 142 is capable of being moved (lowered/raised) by a hydraulic actuator 111A via the lift linkage 144.

In this embodiment, the power system 141 comprises the above-described pump motor 65 and main controller 50, wherein the motor 65 is coupled to a hydraulic pump 116 by a coupler 116B to directly drive the pump 116. The coupler 116B may comprise a rotating axle connected between crank shaft of the motor 65 and the pump 116, or may comprise a viscous coupling, etc. The pumping action of the pump 116 directs hydraulic fluid from the reservoir 116A to the manifold 117, and hydraulic fluid from the manifold 117 flows to the hydraulic actuator 111A using pipes/tubes.

As noted, the keypad 56 includes user operable interface such as buttons, levers, etc., for receiving operator commands for operating the lift gate (e.g., lower/raise platform, stow/unstow lift gate). The keypad 56 also includes display devices (and may include audio devices) for providing the operator with information about one or more of the lift gate, the actuator system, the power system, etc.

The operator commands from the keypad 56 are processed by the main controller 50 as discussed herein. The main controller 50 further maintains information (status) about certain operational parameters of the various components of the lift gate assembly 101 (e.g., platform up/down, lift gate stowed/unstowed, actuator condition, temperature). In one embodiment of the invention, the keypad 56 includes a wired connection to the main controller 50. In another embodiment of the invention, the keypad 56 further comprises a wireless communication module (i.e., com 56C) and the main controller 50 further comprises a wireless communication module (i.e., COM 50C), such that the keypad 56 and the main controller 50 communicate wirelessly. In that case, the keypad 56 is a wireless device allowing greater mobility of the keypad 56 when in use by an operator. The wireless communication modules themselves may provide radio frequency communication, infrared communication, etc., using known technologies.

In one embodiment, the main controller 50 functions to ensure that the power system (e.g., pump motor and the actuator system) operates in a way to provide proper level of power to the lift gate as demanded by operation of the lift gate assembly 101 from an operator. The main controller 50 functions to ensure that the lift gate assembly 101 itself is operated properly by an operator, and ensure proper operation of the power system in powering the lift gate assembly 101.

As noted, main controller 50 controls operation of the lift gate based on certain operational parameters of the lift gate assembly 101. For example, after powering on, sensor data are obtained by the controller. Sensor data may include, for example, power supply voltages, electric current, cycle of the operation of the lift, and load on the lift, etc. The obtained sensor data are correlated/compared with parameters pre-stored in a memory of the main controller 50.

Inputs received by the main controller 50 from the keypad 56 are processed and a determination is made as to whether the required conditions are satisfied. The determination may include, for example, comparing the operator input sequence with the stored sequence to determine whether the input sequence is correct, and the lift gate is within operation limits. If the conditions are satisfied, the operation of the lift gate is enabled. If one or more of the conditions are not satisfied, a warning message may be provided to the operator and the main controller 50 further awaits instructions without enabling the motion of the lift gate.

In one example, the motor 65 may be installed in a housing mounted on a frame of the vehicle (e.g., under the vehicle bed) near the hydraulic system and coupled to the pump motor 65 to drive the pump 116 (e.g., via an axle, viscous coupling, etc.). As discussed below, the main controller 50 may be placed in a pump box with the pump motor 65 and the hydraulic pump 116, and connected to various sensors, the pump motor 65, the valves A and E, the lift gate key pad 56, etc. The main controller 50 may also be placed elsewhere on the vehicle, and connected to various sensors, the pump motor 65, the valves A and E, the lift gate key pad 56, etc., in a wired or wireless manner.

The main controller 50 may further be configured to check that one or more conditions are satisfied before operation of the lift gate is allowed, including: checking condition/status of the lift gate components, checking that an operator is authorized to operate the lift gate by challenging the operator to input a correct key code sequence on the keypad, determining an authorization level for the operator based on authorization information, etc.

In one embodiment of the invention, the main controller 50 may be installed in a lift gate system as follows. Disconnect the negative terminal of DC power supply such as battery/batteries. Mount the main controller 50 in the hydraulic pump box 165 on the vehicle. To increase heat dissipation, the main controller 50 is preferably coupled to a steel plate that is attached to the base 166 of the pump box 165. Couple the pump motor Output1 (FIG. 2) of the main controller 50 to the pump motor 65 (e.g., using a copper strap that is at least 5/8" wide and 0.065" thick (16 gauge)). Couple the battery Input1 of the main controller to the battery positive cable. Ground main controller 50 to ground. Couple pump motor thermal switch 62 to Input2 of the main controller 50. For a power down lift connect Input3 to ground. For a gravity down lift leave Input3 unconnected. Couple Output2 of the main controller 50 to coil terminal of Valve A (and Lock Valve if present) of the hydraulic system. Other terminal of the valve coil should be grounded. Couple Output3 of the main controller 50 to coil terminal of Valve E of the hydraulic system. Other terminal of the valve coil should be grounded. Mount the keypad 56 to secure metal surface on the vehicle or pump box, etc. Attach the terminal from the keypad 56 to the main controller 50. Reconnect the negative terminal of the battery. The main controller 50 and keypad 56 should power on and be operational.

The solid state solenoid switch device 51 is advantageous over conventional mechanical solenoids. A conventional solenoid typically comprises an electrical conductive coil of wire wound around a ferromagnetic core such as a solid iron core. When electrical current is applied to the coil, a resulting magnetic field is focused by the core, thereby providing an electromagnet function. Often such conventional solenoids are used to turn ON/OFF high current devices based on such electromagnetic function, such as magnetically attracting (engaging) a contact for closing an electrical circuit when the solenoid coil is energized.

Conventional solenoids, however, are problematic in a first respect because such solenoids require high current (several amperes) to engage. Such solenoids are also problematic in a second respect because the solenoid may mechanically "stick" to the switch contact (keeping the switch ON), even when the coil is de-energized. In situations where it would be catastrophic for the solenoid to fail in the ON position, an approach involves using two solenoids in series so that if one solenoid sticks, the other can still function and turn OFF the solenoid output. However, when two solenoids are used, twice as much current is required to turn both ON, and there is no indication to an operator if one of the solenoids sticks.

In one embodiment, the solid state solenoid switch device 51 comprises a solid state relay device including metal-oxide field-effect transistors (FETs). Specifically, the solid state solenoid switch device 51 comprises a first FET bank (FET Bank1), and a second FET bank (FET Bank2) connected in series with the first FET bank. The microcontroller 52 is further configured for detecting an operational failure of at least one of the FET banks, and turning at least one of the FET banks OFF in response, thereby turning power to a direct current (DC) load OFF. In this example, the DC load comprises the electric pump motor 65 for operating the lift gate. The microcontroller 52 may also detect an operational failure of one of the FET banks, and turn the other FET bank OFF in response, thereby turning power to the DC load OFF.

In one embodiment, the solid state solenoid switch device 51 is configured as a DC relay for controlling DC devices (loads) of up to, e.g., 100 amperes (amps). The solid state solenoid switch device 51 utilizes the two independently controlled switches FET Bank1 and FET Bank 2. Each bank of FETs comprises one or more FETs in parallel. Increasing the number of FETs or the size of FETs increases the current capabilities of the solid state solenoid switch device 51.

Using two FET banks prevents the Output1 of the solid state solenoid device 51 from staying ON in the event of a single FET bank failure, because the other FET bank can function to turn the rely output OFF. The solid state solenoid device 51 requires a few milliamps of power for operation. The main controller may include indicators, such as LEDs for indicating each shorted or open FET over varying temperature or over current conditions.

Figure 6:
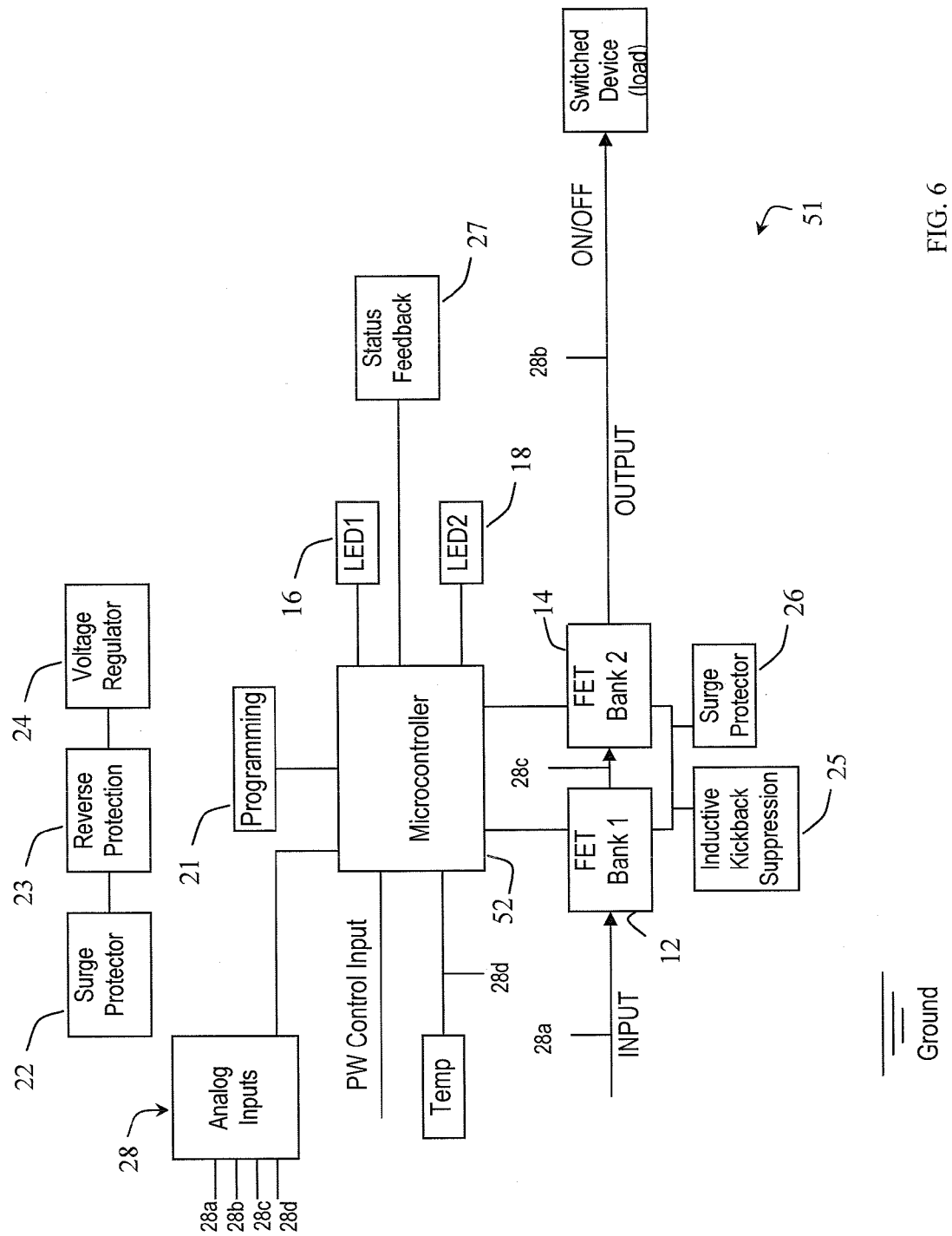
FIG. 6 shows a block diagram of a solid state solenoid switch device of the main controller of FIG. 2, according to an embodiment of the invention.

FIG. 6 shows a block diagram of an implementation of the solid state solenoid device 51 in conjunction with the microcontroller 52, according to an embodiment of the invention. The solid state solenoid device 51 includes said FET banks 12, 14 (i.e., FET Bank1 and FET Bank 2), and LEDs 16, 18. Each FET bank includes one or more FETs connected in parallel. The microcontroller 52 is configured to control the internal operation of the FET banks and provides status information. These and other functions of the microcontroller 52 can be programmed using a programming module 21.

The INPUT for the solid state solenoid device 51 provides Power In (e.g., from battery 64 in FIG. 2) and OUTPUT provides Power Out for the switched device (e.g., DC pump motor 65). The solid state solenoid device 51 may include a surge protector 22, a reverse protection function 23 and a voltage divider 24. The solid state solenoid device 51 may further include inducting kickback suppression module (e.g., diode) 25 and surge protector 26. When the solid state solenoid device 51 is used to power a load with an inductive load, then when the OUTPUT is turned off, the inductive element causes a negative voltage spike. The suppression module 25 suppresses negative spikes. The surge protector 26 suppresses high voltage spikes that may be present on the OUTPUT.

The solid state solenoid device 51 further includes a status feedback (FB) function 27 which is at, e.g., 5V when the OUTPUT is ON, and at 0V when the OUTPUT is OFF. The FB 27 comprises a digital output that may be used to provide a feedback signal to indicate if the relay is operating. In one example, the FB goes high if the OUTPUT is on.

The solid state solenoid device 51 may further include analog inputs 28. In this example there are four analog inputs 28a, 28b, 28c and 28d to the microcontroller 51, three of which read voltage and one reads temperature. The three analog inputs 28a, 28b, 28c that read voltage are connected to the INPUT, the OUTPUT, and the connection between the two banks of FET banks. The analog input 28d is connected to a temperature sensor that converts temperature to voltage. A ground back plate for a printed circuit board implementation of the solid state solenoid device 51, provides electrical contact to ground. A PW Control input (e.g., 12V) turns on the OUTPUT, open or 0V turns OFF the OUTPUT.

In one example operation, based on the status of the FET banks as monitored by the microcontroller 52, the microcontroller 52 provides the following status information using the LED 16 (e.g., Green LED) and LED 18 (e.g., Red LED):

Green LED on—OUTPUT is ON.
Green LED flashing fast—INPUT Voltage is above 16.5V (Fast is 5 flashes per second).
Green LED flashing slowly—Voltage is below 8.0V (Slow is 1 flash per second).
Red LED flashing fast—Over current. By taking the voltage difference across the two FET banks, the current that is passing through the relay to the load is approximated.
Red LED flashing slowly—Over temperature (over 100° C.).
Red LED 3 short flashes—Shorted FET, indicating one of the FET banks has malfunctioned.
Red LED 2 short flashes—Open FET, indicating an FET bank is open.
FETs fail in one of two ways, open or shorted. An open FET will not turn ON and a shorted FET will not turn OFF.

The microcontroller 52 further manages the operation of the solid state solenoid device 51, described by an example as follows. When the solid state solenoid device 51 is first powered on, both LEDs turn on for 500 ms, and then turn back off. The solid state solenoid device 51 then goes into power down mode to minimize power consumption. Applying 12V to the PW Control input wakes up the solid state solenoid device 51, wherein the microcontroller 52 reads the INPUT (i.e., voltage at the input of the first FET bank), and also reads the voltage at the output of the first FET bank (i.e., voltage at the input of the second FET bank). The microcontroller 52 also reads the OUTPUT voltage (i.e., output voltage of the second FET bank). The microcontroller 52 may also read the temperature (via an internal temperature sensor Temp).

While the PW Control is ON, if at any time the INPUT voltage drops below 8.0 V or greater than 16.5 V, or if the temperature goes above 100° C., or if the current exceeds about 100 amps, then the microcontroller 52 turns both FET banks OFF and flashes the LEDs 16, 18 to indicate an error condition. The temperature between the two banks of FETs is measured with a temperature sensor that is read by the microcontroller 52. If one of the banks of FET banks has failed (either open or shorted) then the error condition is indicated (i.e., the error is a failed FET). If a bank of FETs is open the relay function of the solid state solenoid device 51 no longer operates. If a bank of FETs is shorted, then the microcontroller 52 turns off that FET bank to prevent the other FET bank from failing. As such, the microcontroller 52 prevents the load from being "stuck" ON. With two banks of FETs in series, if one of the FET banks shorts out then the other FET bank can still be turned OFF, thus turning OFF the output to the load. If such an error condition is not detected, then the microcontroller 52 turns ON one FET bank at a time and verifies that the FET banks are not shorted or opened. If the microcontroller 52 detects an open or shorted FET bank, then the microcontroller 52 turns that FET bank off and flashes the LEDs as indicated above.

To verify that the FET banks are not shorted or open, the microcontroller 52 first checks the voltage at the output of the first FET bank 12 (i.e., FET Bank 1). If that voltage is present, then the microcontroller 52 indicates a shorted FET (i.e., first FET bank has shorted). If no voltage is present at the output of the first FET bank 12, then the microcontroller 52 turns ON the first FET bank and then verifies that the voltage at the output of the first FET bank is present (e.g., turns ON or goes above 0V). If that voltage is still not present, then the microcontroller 52 turns the first FET bank back OFF, and indicates an open FET bank via the LEDs.

If the first FET bank 12 operates properly however, then the microcontroller 52 performs the same operations for the second FET bank 14 (i.e., FET Bank2), as the microcontroller 52 attempts to turn ON the second FET bank 14.

If the microcontroller 52 can turn either one of the FET banks ON based on the above process, then the solid state solenoid device 51 is operational. In one example, the redundant FET banks 12, 14 allow reliable control of a DC load (switched device) of, e.g., up to 100 amps. With the FET banks in series, a serious short condition still allows the microcontroller 52 to shut off (turn OFF the OUTPUT to power down the load). Further, the solid state solenoid device 51 can change state (ON/OFF) with using a few milliamps of current and the LEDs 16, 18 indicate error conditions. The solid state solenoid device 51 may also perform a self-check of the FET banks at startup (described above) to ensure there are no error conditions. If there are error conditions, the solid state solenoid device 51 indicates such using the LEDs and will not turn either FET bank ON.

In one example, when the PW Control is released or goes to 0V the OUTPUT should turn OFF. PW is an input to the relay and it is set high to turn ON the OUTPUT, and is set low to turn off the OUTPUT. When the PW Control is released or goes to 0V, then the microcontroller 52 turns off both FET banks and the LEDs, and powers down.

Figure 7:
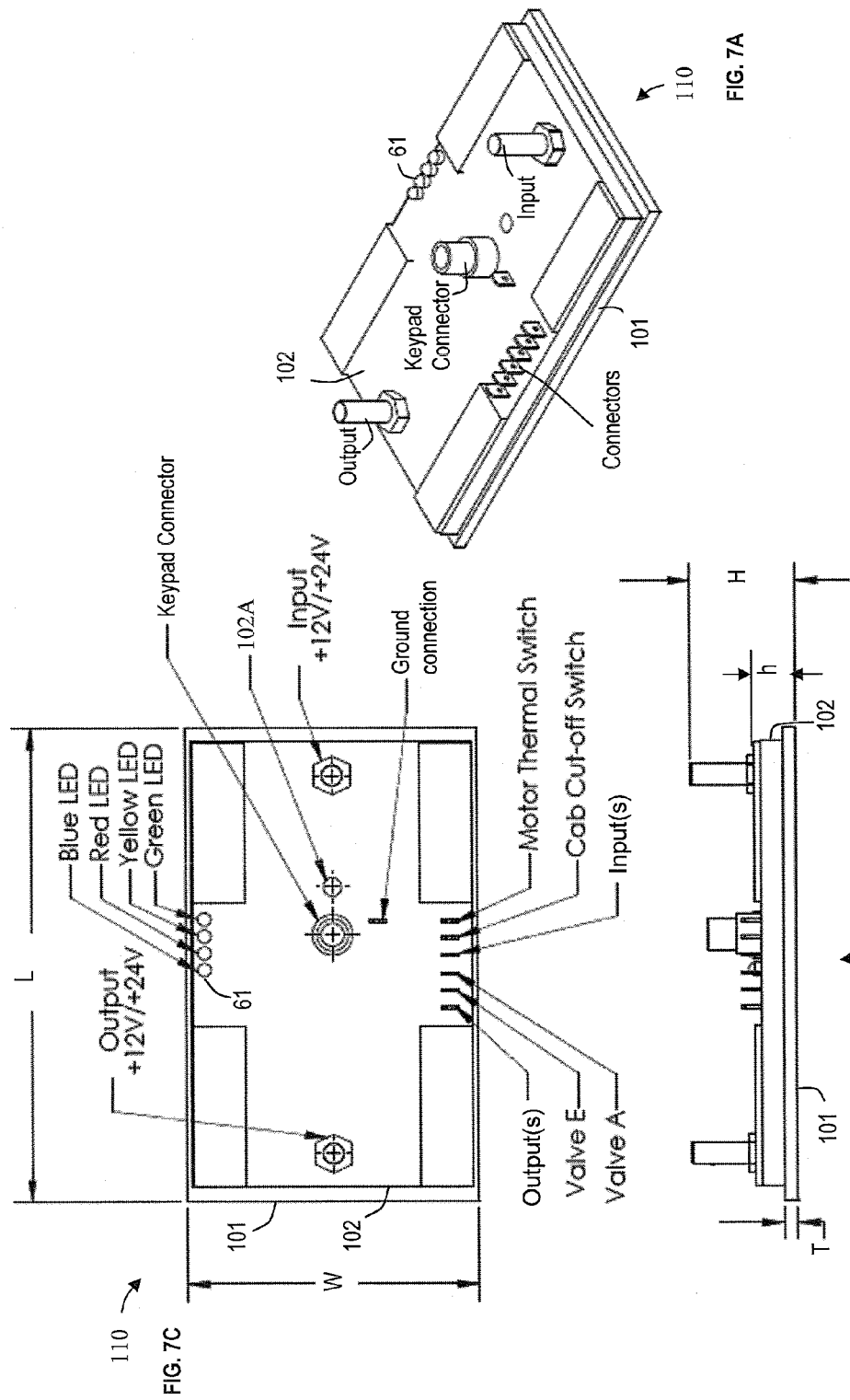
FIGS. 7A-7C show different views of a form factor of an example implementation of the main controller of FIG. 2, according to an embodiment of the invention.

FIGS. 7A-C show a perspective view, a side view and a top view of a form factor 110, respectively, for an example implementation for the main controller 50 of FIG. 2, according to an embodiment of the invention. The form factor 110 implements a main controller 50 therein that integrates function including the functions of lift gate control and also a solid state solenoid switch relay device, all on one support member (e.g., printed circuit board). In this embodiment, the main controller form factor 110 includes the components of the main controller 50 in FIG. 2, disposed on an essentially planar and rigid support member 101 having a length L, width W and thickness T (FIG. 7C).

In one example, the length L is about 6 to 8 inches (preferably about 7 inches), the width W is about 4 to 5 inches (preferably about 4.25 inches), and thickness T is about 0.15-0.25 inches (preferably about 0.19 inches). The support member 101 may comprise a printed circuit board (PCB) with electrical connections (traces) thereon for interconnecting various components of the main controller. The form factor 110 further includes an essentially rectangular cover (housing) 102 on the support member 101, wherein the cover 102 covers the components of the main controller on the support member 101. The cover 102 may comprise a rigid material such as metal that allows cooling of the main controller components.

As shown in FIG. 7A, the cover 102 includes openings for exposing connectors including: input(s), output(s), cab cutoff switch, motor thermal switch, Valve A, Valve E, ground connection, keypad connection, input/output power connectors (+12V or +24V), as further illustrated in FIG. 7C. The power connectors may have a height H (FIG. 7B) about e.g. 1.5 inches. The combined height h of the cover 102 along with the support element 101 is about e.g. 0.5 to 0.75 inches.

Figure 8:
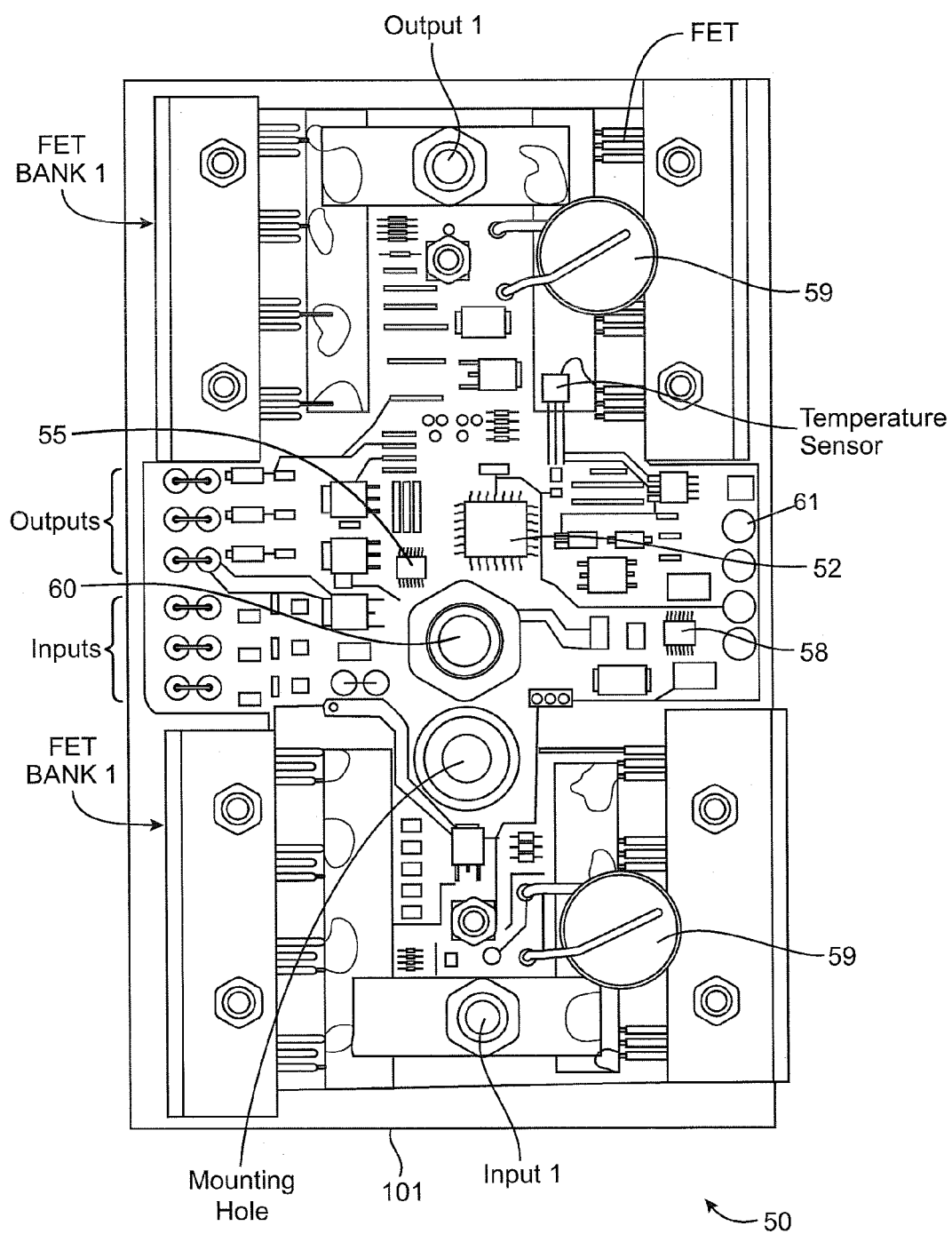
FIG. 8 shows a top view of schematic of an implementation of the main controller of FIG. 2, according to an embodiment of the invention.

The cover 102 further includes openings for exposing display devices including LEDs 61. The support member 101 and cover 102 include a mounting opening 102A for mounting the form factor 110 on a support surface such as frame or body of a vehicle. The cover 102 may be detachably attached to the support member 101 via connectors such as screws or other means. FIG. 8 shows a top view schematic of an example implementation of the main controller 50 of FIG. 2 on the support member 101 under the housing 102 in FIGS. 7A-7C according to the shape and dimensions of the form factor 110, according to an embodiment of the invention.

The main controller device may be used with different lift gate systems by simply connecting the input/output connectors of the main controller device to corresponding the lift gate system controls, and coupling the main controller device to a power source such as vehicle battery.

As is known to those skilled in the art, the aforementioned example architectures described above, according to the present invention, can be implemented in many ways, such as program instructions for execution by a processor, as software modules, microcode, as computer program product on computer readable media, as logic circuits, as application specific integrated circuits, as firmware, etc.

The embodiments of the invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer, processing device, or any instruction execution system. For the purposes of this description, a computer-usable or computer readable medium can be any apparatus that can contain, store, communicate, or transport the program for use by or in connection with the instruction execution system, apparatus, or device.

I/O devices (including but not limited to keyboards, displays, pointing devices, etc.) can be connected to the system either directly or through intervening controllers. Network adapters may also be connected to the system to enable the data processing system to become connected to other data processing systems or remote printers or storage devices through intervening private or public networks. Modems, cable modem and Ethernet cards are just a few of the currently available types of network adapters. In the description above, numerous specific details are set forth. However, it is understood that embodiments of the invention may be practiced without these specific details. For example, well-known equivalent components and elements may be substituted in place of those described herein, and similarly, well-known equivalent techniques may be substituted in place of the particular techniques disclosed. In other instances, well-known structures and techniques have not been shown in detail to avoid obscuring the understanding of this description.

The terms "computer program medium," "computer usable medium," "computer readable medium," and "computer program product," are used to generally refer to media such as main memory, secondary memory, removable storage drive, a hard disk installed in hard disk drive, and signals. These computer program products are means for providing software to the computer system. The computer readable medium allows the computer system to read data, instructions, messages or message packets, and other computer readable information, from the computer readable medium. The computer readable medium, for example, may include non-volatile memory, such as a floppy disk, ROM, flash memory, disk drive memory, a CD-ROM, and other permanent storage. It is useful, for example, for transporting information, such as data and computer instructions, between computer systems. Furthermore, the computer readable medium may comprise computer readable information in a transitory state medium such as a network link and/or a network interface, including a wired network or a wireless network that allow a computer to read such computer readable information. Computer programs (also called computer control logic) are stored in main memory and/or secondary memory. Computer programs may also be received via a communications interface. Such computer programs, when executed, enable the computer system to perform the features of the present invention as discussed herein. In particular, the computer programs, when executed, enable the processor or multi-core processor to perform the features of the computer system. Accordingly, such computer programs represent controllers of the computer system. The wireless protocol for communication between the various modules may comprise protocols such as IEEE 802.11, Bluetooth, Personal Area Network, control signals at different frequencies reflecting different tunable signals, FM, AM, packet communication, TCP/IP and other technologies which those skilled in the art recognize.

Generally, the term "computer-readable medium," as used herein, refers to any medium that participated in providing instructions to a processor for execution. Such a medium may take many forms, including but not limited to, non-volatile media, volatile media and transmission media. Non-volatile media includes, for example, optical or magnetic disks, such as a storage device. Volatile media includes dynamic memory, such as a main memory. Transmission media includes coaxial cables, copper wire and fiber optics, including the wires that comprise a bus. Transmission media can also take the form of acoustic or light waves, such as those generated during radio wave and infrared data communications.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, an EPROM, a FLASH-EPROM, any other memory chip or cartridge, a carrier wave as described hereinafter, or any other medium from which a computer can read.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A lift gate system, comprising:
an interface device for receiving operation information from an operator for controlling a lift gate assembly including an actuator system for actuating a lift gate;
a main controller device configured for controlling the actuator system, wherein the main controller device comprises:
a solid state relay switch for selectively directing electrical power to the actuator system;
a microcontroller configured for controlling the solid state relay switch based on operator commands and based on satisfaction of at least one condition, for controlling operation of the lift gate assembly;

wherein the actuator system comprises a hydraulic actuator system including a direct current hydraulic pump motor for powering a hydraulic pump to actuate an actuator; and the solid state switch device is configured for selectively turning power to the pump motor ON and OFF in response to control signals from the microcontroller, the solid state switch device comprising a first field effect transistor (FET) bank, and a second FET bank connected in series with the first FET bank.

2. The lift gate system of claim 1, wherein:
the microcontroller is further configured for determining that at least one condition is satisfied, and upon satisfaction of each condition, controlling the relay switch for selectively directing electrical power to the actuator system.

3. The lift gate system of claim 1, wherein the main controller device is further configured for controlling the operation of the lift gate to fold and unfold a lift platform, and to raise and lower the lift platform, based on satisfaction of one or more conditions.

4. The lift gate system of claim 3, wherein:
the main controller device further comprises an onboard display device configured for displaying status information based on status signals from the microcontroller.

5. The lift gate system of claim 4, further comprising a lift gate assembly including an actuator system for actuating a lift gate.

6. The lift gate system of claim 5, further comprising:
a cutoff switch coupled to the main controller device to enable/disable functions of the main controller device; and
a thermal switch for providing thermal information for a lift gate hydraulic pump motor to the main controller device.

7. The lift gate system of claim 5, wherein:
the interface device comprises a keypad and a display device;
the keypad is configured for receiving operation information from an operator;
the display device is configured for displaying lift gate operations status information based on status information from the main controller device.

8. The lift gate system of claim 7, wherein:
the actuator system further comprises a valve for directing flow of hydraulic fluid between a reservoir and the actuator, and
the microcontroller is further configured for controlling the operation of the valves for directing flow of hydraulic fluid between a reservoir and the actuator.

9. The lift gate system of claim 5, wherein the main controller device further comprises:
an essentially planar support member configured for supporting thereon the solid state relay device and the microcontroller.

10. The lift gate system of claim 9, wherein:
the main controller device further comprises an onboard power regulation device and electrical input/output connectors;
the support member is further configured for supporting thereon said onboard power regulation device and said electrical input/output connectors.

11. The lift gate system of claim 9, wherein the support member comprises a printed circuit board about 7 inches long and 4.5 inches wide.

12. The lift gate system of claim 9, wherein the main controller device further comprises a cover adapted for coupling to the support member to cover the components supported by the support member.

13. A lift gate system, comprising:
a lift gate assembly including an actuator system for actuating a lift gate, the actuator system comprising a hydraulic actuator system including a direct current hydraulic pump motor for powering a hydraulic pump to actuate an actuator;
an interface device for receiving operation information from an operator for controlling a lift gate assembly including an actuator system for actuating a lift gate;
a main controller device configured for controlling the actuator system, wherein the main controller device comprises:
a solid state relay switch for selectively directing electrical power to the actuator system;
a microcontroller configured for controlling the solid state relay switch based on operator commands and based on satisfaction of at least one condition, for controlling operation of the lift gate assembly by controlling the relay switch for selectively directing electrical power to the actuator system, wherein the microcontroller is further configured for controlling the operation of the lift gate to fold and unfold a lift platform, and to raise and lower the lift platform, based on satisfaction of one or more conditions;
an onboard display device configured for displaying status information based on status signals from the microcontroller; and
a support member configured for supporting thereon, and electrically coupling, the solid state relay device, the microcontroller, and the onboard display device;
wherein the solid state switch device is configured for selectively turning power to the pump motor ON and OFF in response to control signals from the microcontroller, the solid state switch device comprising a first field effect transistor (FET) bank, and a second FET bank connected in series with the first FET bank.

14. The lift gate system of claim 13, wherein:
the interface device comprises a keypad and a display device; the keypad is configured for receiving operation information from an operator; the display device is configured for displaying lift gate operations status information based on status information from the main controller device.

15. The lift gate system of claim 14, further comprising:
a cutoff switch coupled to the main controller device to enable/disable functions of the main controller device; and
a thermal switch for providing thermal information for a lift gate hydraulic pump motor to the main controller device.

16. The lift gate system of claim 14, wherein:
the actuator system further comprises a valve for directing flow of hydraulic fluid between a reservoir and the actuator, and
the microcontroller is further configured for controlling the operation of the valves for directing flow of hydraulic fluid between a reservoir and the actuator.

17. The lift gate system of claim 16, wherein:
the main controller device further comprises an onboard power regulation device and electrical input/output connectors; and
the support member is further configured for supporting thereon said onboard power regulation device and said electrical input/output connectors.

18. The lift gate system of claim 13, wherein:
the main controller device further comprises a cover adapted for coupling to the support member to cover the components supported by the support member;
the support member comprises a printed circuit board about 6 to 8 inches long, about 4 to 5 inches wide, and the combined height of the cover and the support member is about 0.5 to 0.75 inches.

19. A lift gate system, comprising:
a lift gate assembly including an actuator system for actuating a lift gate;
an interface device for receiving lift gate operation information from an operator;
a main controller device configured for controlling the actuator system, wherein the main controller device comprises:
a solid state relay switch for selectively directing electrical power to the actuator system;
a microcontroller configured for controlling the solid state relay switch based on operator commands and determining that one or more conditions are satisfied, and upon satisfaction of each condition, controls the relay switch for selectively directing electrical power to the actuator system;
wherein the microcontroller is further configured for detecting an operational failure of one of the FET banks, and turning the failed FET bank OFF in response, thereby turning power to the hydraulic pump motor OFF; and
the microcontroller is configured for detecting an operational failure of one of the FET banks, and turning the other FET bank OFF in response, thereby turning power to the pump motor OFF.

20. The lift gate system of claim 19, wherein the microcontroller is configured for detecting high and low voltage thresholds, and operating within the thresholds.

21. The lift gate system of claim 19, wherein the microcontroller is further configured for limiting current to the hydraulic pump motor and for providing feedback on the status of the lift gate assembly.

22. The lift gate system of claim 19, wherein the microcontroller is further configured for turning OFF upon detecting temperatures above a threshold.

23. The lift gate system of claim 19, wherein the microcontroller is further configured for providing feedback on the operation status of the FET banks.

24. The lift gate system of claim 1, wherein the microcontroller is further configured to prevent the output of the solid state relay from staying ON when one FET bank fails.

25. The lift gate system of claim 24, wherein:
the microcontroller is further configured for detecting an operational failure of one of the FET banks, and turning the failed FET bank OFF in response, thereby turning power to the hydraulic pump motor OFF.

26. The lift gate system of claim 24, wherein:
the microcontroller is further configured for detecting an operational failure of one of the FET banks, and turning the other FET bank OFF in response, thereby turning power to the hydraulic pump motor OFF.

27. The lift gate system of claim 24, wherein the microcontroller is further configured for:
turning ON one FET bank at a time and verifying that the FET banks are not shorted or opened; and
in response to detecting an open or shorted FET bank, turning that FET bank OFF.

28. The lift gate system of claim 19, wherein the microcontroller is further configured for:
turning ON one FET bank at a time and verifying that the FET banks are not shorted or opened; and
in response to detecting an open or shorted FET bank, turning the open or shorted FET bank OFF.

* * * * *